(12) United States Patent
Watanabe et al.

(10) Patent No.: US 6,600,157 B2
(45) Date of Patent: Jul. 29, 2003

(54) SEMICONDUCTOR DEVICE, AND RADIATION DETECTION DEVICE AND RADIATION DETECTION SYSTEM HAVING SAME

(75) Inventors: Minoru Watanabe, Kanagawa (JP); Satoshi Okada, Kanagawa (JP); Toshiko Koike, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 140 days.

(21) Appl. No.: 09/888,608

(22) Filed: Jun. 26, 2001

(65) Prior Publication Data

US 2002/0044141 A1 Apr. 18, 2002

(30) Foreign Application Priority Data

Jun. 27, 2000 (JP) ........................ 2000-193337
Sep. 18, 2000 (JP) ........................ 2000-282331

(51) Int. Cl.$^7$ ........................... G01T 1/24; H01L 31/115
(52) U.S. Cl. ........................... 250/370.08; 250/370.09; 250/370.14; 257/59; 257/72; 257/443; 257/448; 349/42; 349/46; 438/57; 438/66; 438/73
(58) Field of Search ................... 250/370.08, 370.09, 250/370.14; 257/57, 59, 66, 72, 428, 429, 430, 444, 443, 448; 349/42, 43, 46, 47; 438/57, 60, 66, 73

(56) References Cited

U.S. PATENT DOCUMENTS

| | | | | |
|---|---|---|---|---|
| 5,614,730 A | * | 3/1997 | Nakazawa et al. | 257/59 |
| 5,726,461 A | * | 3/1998 | Shimada et al. | 257/59 |
| 5,981,931 A | * | 11/1999 | Kinno et al. | 250/208.1 |
| 6,239,439 B1 | * | 5/2001 | Itabashi et al. | 25/370.11 |
| 6,476,416 B1 | * | 11/2002 | Ikeda | 257/59 |
| 2002/0017666 A1 | * | 2/2002 | Ishii et al. | 257/291 |

* cited by examiner

Primary Examiner—Constantine Hannaher
Assistant Examiner—Albert Gagliardi
(74) Attorney, Agent, or Firm—Fitzpatrick, Cella, Harper & Scinto

(57) ABSTRACT

A semiconductor device is provided which comprises a thin film transistor (TFT) comprising a gate electrode formed on an insulating substrate, a gate insulating film formed on the gate electrode, and a pair of electrodes having a semiconductor layer and an ohmic contact layer therebetween; and a gate wiring connected to the gate electrode, and a signal wiring connected to one of the pair of electrodes, wherein the gate wiring and the signal wiring are arranged in superposition in the film thickness direction with an interlayer insulating layer therebetween to have a plurality of crossings with each other and the interlayer insulating layer has a plurality of steps overstriding a lower wiring at the crossings. A radiation detection device and a radiation detection system that have the semiconductor device are also provided.

17 Claims, 5 Drawing Sheets

SEMICONDUCTOR DEVICE, AND RADIATION DETECTION DEVICE AND RADIATION DETECTION SYSTEM HAVING SAME

BACKGROUND OF THE INVENTION

1. Field of the Invention

The present invention relates to a semiconductor device, and more particularly to a liquid crystal panel, a radiation detection device and a radiation detection system that use TFTs.

2. Related Background Art

Currently, the tendency of enlargement of the picture area of panels using thin film transistors (TFTs) has been accelerated. The tendency results from the development in manufacturing technique for liquid crystal panels using TFTs and the increase in applicability of area sensors having photoelectric conversion elements to various fields (for example, X-ray imaging apparatuses). Further, with the tendency of enlargement of the picture area, the pixel pitch becomes finer.

FIG. 5 is a schematic view showing an example of a photoelectric conversion device using a TFT matrix panel. The device consists of gate lines 53 for driving TFTS, photoelectric conversion elements 55 each consisting of a PIN-type diode, bias lines 52, signal lines 51 and TFT sections 57.

Carriers as generated by light incidence to the photoelectric conversion element 55 are stored, and when reading out the stored carriers, the gate line 53 is biased to effect readout. At this time, the driving speed of TFTs is limited by the resistance of the gate line 53. Especially, with photoelectric conversion devices, there is a problem that increase of wiring resistance increases the sensor noise, in addition to limiting the response speed. This is attributable to the floating capacitance of a crossing of the gate line 53 with the bias line 52 or the signal line 51.

Additionally, as the pixel pitch of the panels becomes finer, the aperture ratio per pixel becomes small. The reason is that in order to accomplish the finer pixel pitch while optimizing the performance of TFT as the switching element as well as the wiring resistance, it becomes necessary to reduce the electrode area of the aperture section. This will decrease the transmittance of the backlight of liquid crystal panels using TFTs to lower the luminance of the liquid crystal display. Furthermore, in an imaging device such as a photoelectric conversion device, the area of a light receiving section will be reduced to result in lowering of the sensitivity.

Therefore, in order to solve the two technical problems, it is considered that the film thickness of each wiring is increased to reduce the wiring resistance and to increase the aperture area. However, merely increasing the film thickness of the gate line 53 will deteriorate the coverage of an interlayer insulating film of a crossing of the gate line with other wirings to make it difficult to maintain the dielectric strength. Further, there is a possibility that the reduced thickness of the insulating film may increase the floating capacitance.

On the other hand, when the thickness of the insulating film is increased in order to thicken the wiring to reduce its resistance and to maintain the dielectric strength of the crossing, the driving capability of the TFTs will be lowered. Therefore, when the driving speed is to be increased, the driving voltage needs to be raised, which necessitates further increase of the dielectric strength.

Thus, the enlargement of the panels needs to reduce the resistance of a lower wiring such as the gate line, that is, a wiring located nearest to the substrate.

SUMMARY OF THE INVENTION

It is, therefore, an object of the present invention to increase the metal film thickness of a lower metal wiring and to reduce the wiring resistance, thereby assuring the coverage of an interlayer insulating film formed between the lower metal wiring and an upper metal wiring to secure the reliability.

According to a first aspect of the present invention, there is provided a semiconductor device comprising:

a thin film transistor (TFT) comprising a gate electrode formed on an insulating substrate, a gate insulating film formed on the gate electrode, and a pair of electrodes having a semiconductor layer and an ohmic contact layer therebetween; and a gate wiring connected to the gate electrode, and a signal wiring connected to one of the pair of electrodes, wherein the gate wiring and the signal wiring are arranged in superposition in the film thickness direction with an interlayer insulating layer therebetween to have a plurality of crossings with each other and the interlayer insulating layer has a plurality of steps overstriding a lower wiring at the crossings.

According to a second aspect of the present invention, there is provided a semiconductor device comprising:

a thin film transistor (TFT) comprising a gate electrode formed on an insulating substrate, a gate insulating film formed on the gate electrode, and a pair of electrodes having a semiconductor layer and an ohmic contact layer therebetween; and a gate wiring connected to the gate electrode, and a signal wiring connected to one of the pair of electrodes, wherein the gate wiring and the signal wiring are arranged in superposition in the film thickness direction with an interlayer insulating layer therebetween to have a plurality of crossings with each other, the interlayer insulating layer has a plurality of steps overstriding a lower wiring at the crossings, and the film thickness of the lower wiring is smaller at the crossings than at a portion thereof not crossing.

DETAILED DESCRIPTION OF THE PREFERRED EMBODIMENTS

Now, preferred embodiments of the present invention will be described with reference to the drawings.

(Embodiment 1)

Figure 1:
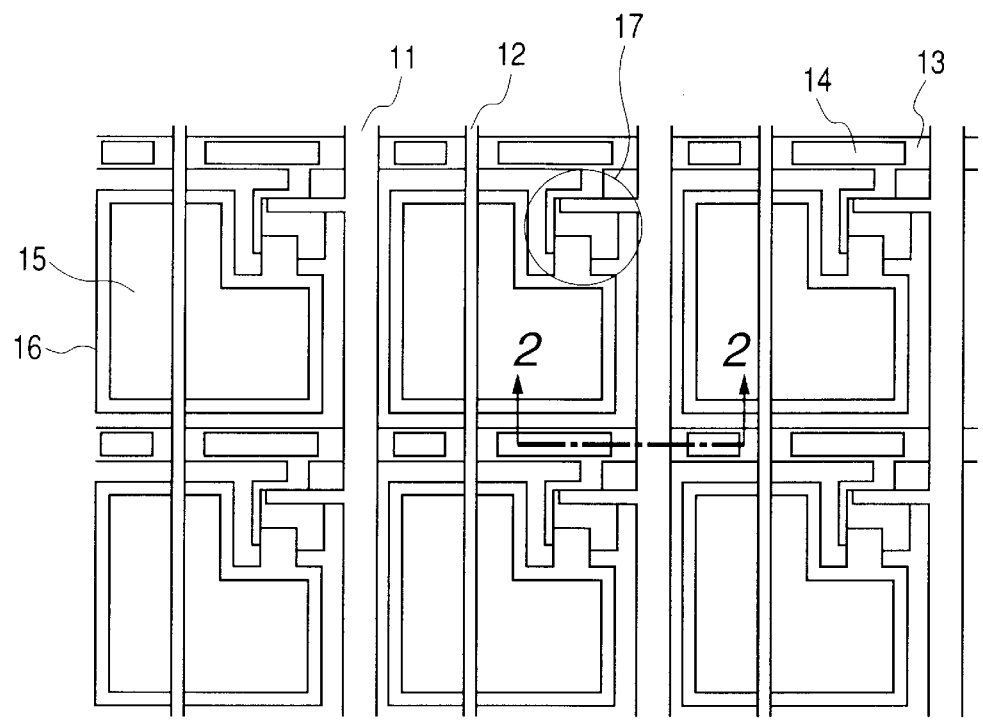
FIG. 1 is a schematic view showing a pattern of a TFT matrix panel according to a first embodiment of the present invention.

FIG. 1 is a schematic view showing a pattern of a photoelectric conversion device using a TFT matrix panel as the semiconductor device according to Embodiment 1 of the present invention. In this embodiment, the film thickness of a gate line at crossings is smaller than that of a portion not crossing.

The photoelectric conversion device of FIG. 1 consists of signal lines 11, bias lines 12, gate lower wirings 13, gate upper wirings 14, photoelectric conversion elements 15, lower electrodes 16, and TFT sections 17. The gate lower wiring 13 and the corresponding gate upper wiring 14 form a gate line. The TFTs 17 arranged in a matrix pattern are driven by a bias applied by a driver (not shown) to the gate line 13. In this embodiment, each photoelectric conversion element 15 has a PIN structure consisting of p-type a-Si (amorphous silicon), i-type a-Si, and n-type a-Si and carriers generated by light incidence on the photoelectric conversion elements 15 are read out from the lower electrodes 16. At this time, the bias lines 12 connected to a common electrode driver are each maintained at a constant potential.

Figure 2:
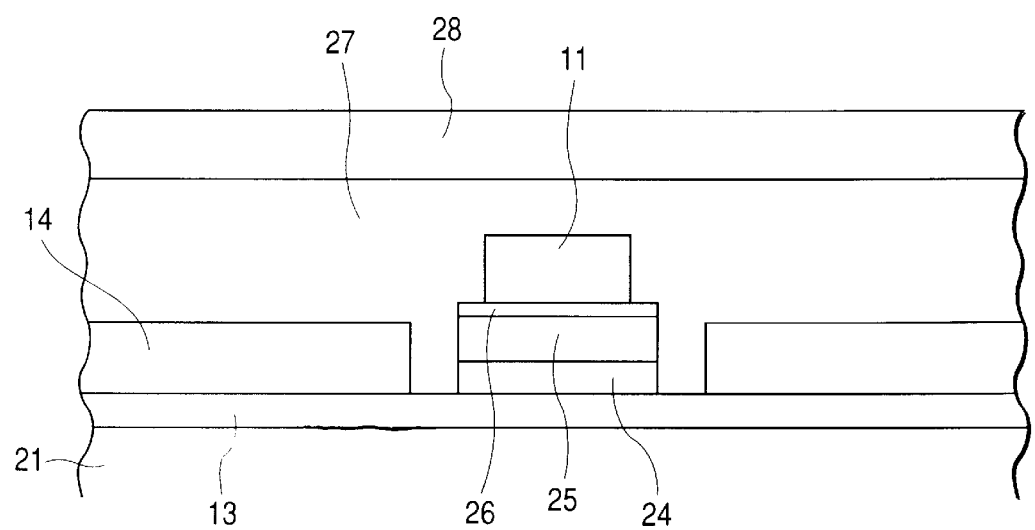
FIG. 2 is a sectional view taken along line 2—2 of FIG. 1.

Now, crossings between wirings will be described. For the purpose of description, a crossing of the gate line with the signal line 11 is described herein. FIG. 2 shows a sectional view taken along line 2—2 of FIG. 1. In this embodiment, the gate line 13 is a wiring arranged nearest to a substrate of wirings formed on the substrate. In the figure, reference numeral 21 denotes an insulating substrate, 13 denotes the gate lower wiring, 14 denotes the gate upper wiring, 24 denotes an insulating film, 25 denotes an i-type semiconductor layer, 26 denotes an n$^+$-type semiconductor layer, 11 denotes the signal line, 27 denotes a first protective film, and 28 denotes a second protective film.

Here, a method of fabricating the TFT panel according to this embodiment is described below.

1. An Al film is formed entirely on a surface of the substrate and then patterned through photolithography or the like in a pattern corresponding to the pattern of the gate lower wiring 13 to form the gate lower wiring 13.
2. The insulating layer 24 is formed of SiN in a thickness of 2000 to 4000 Å, then the i-type semiconductor layer 25 is formed of a-Si in a thickness of 400 to 3000 Å and the n$^+$-type semiconductor layer 26 is further formed of a-Si in a thickness of 300 to 2000 Å by a continuous film forming process.
3. Then, the gate wiring, and the insulating layer 24, the i-type semiconductor layer 25, and the n$^+$-type semiconductor layer 26 of the photoelectric conversion element are patterned through photolithography and removed in the pattern by the RIE method.
4. The photoelectric conversion element and the TFT section are masked and the signal line 11 and the gate upper wiring 14 are formed.
5. The TFT section 17 and the wiring are masked and the PIN-type photoelectric conversion element 15 is formed.
6. A prescribed pattern is formed through photolithography, then the n$^+$-film, the a-Si film and the SiN film are simultaneously etched by the RIE method to effect element isolation, and thereafter the protective film 27 made of SiN is formed as a passivation film in a thickness of 3000 to 15000 Å. The bias line 12 is formed of Al or the like in a thickness of about 3000 to 10000 Å, and finally the protective film 28 is formed of an organic material such as polyimide in a thickness of 2 to 10 μm.

The above mentioned steps completes the TFT panel according to this embodiment.

Incidentally, the gate line is made of a tantalum or titanium film of 400 to 3000 Å in thickness and the signal line and the bias line are made of an aluminum film of 500 to 20000 Å in thickness, respectively.

Further, the PIN-type photoelectric conversion element 15 may be made of, for example, a p-type semiconductor layer and an n-type semiconductor layer each having a film thickness of 400 Å to 1500 Å and an i-type semiconductor layer having a film thickness of 4000 Å to 15000 Å.

In this embodiment, the signal line 11 and the gate upper wiring 14 can be simultaneously formed by the same process, which simplifies the process. Incidentally, the film configuration at the crossings between the wirings may be the same as that for the semiconductor layers of the TFT sections 17, so that the TFT sections and at least the crossings may be fabricated through the same process and only the channels of the TFT sections may be formed through dry etching or the like. Therefore, there is no need to provide isolation between the wirings at the crossings using additional steps, so that the crossings can be fabricated through a simple process. Incidentally, the insulating layer 24, the i-type layer 25, and the n$^+$-type layer 26 may be formed not only at the crossings but also entirely below the signal line 11. If a desired dielectric strength can be maintained only by the insulating film 24 in relation with the gate line or the like at the crossings, an additional process may be carried out to remove the other semiconductor layers. Although the crossings between the gate line and the signal line has been described above, it should be noted that the crossings with the bias line 12 may be similarly configured.

The gate line consisting of the gate lower wiring 13 and the gate upper wiring 14 is provided as a single layer to have a reduced film thickness at the crossing between the signal line 11 and the bias line 12 as compared with the other portion as shown in FIG. 1, and there is no overstriding of the insulating film 24 with regard to the gate line consisting of the gate lower wiring 13 and the gate upper wiring 14 so that the dielectric strength is ensured without increasing the film thickness of the insulating layer 24.

Furthermore, improvement in the coverage and dielectric strength of the interlayer insulating film provided between the gate line and the signal line or the bias line as well as the reliability can be ensured. On the other hand, since the two metal layers are provided at the portion other than the crossings to increase the film thickness thus lowering the wiring resistance, the noise is reduced and a higher driving speed is attained. In addition, if a breaking occurs in the gate lower wiring 13 of the gate line and there exists the gate upper wiring 14 in that region, the upper wiring functions as a redundant wiring to maintain electrical conduction, thereby reducing the fraction defective.

In this embodiment, although the gate upper wiring 14 has a single layer configuration, it is needless to say that a multi-layer configuration may be adopted. Further, the semiconductor device according to this embodiment can be used as a radiation detection device by providing a wavelength converter such as GOS (gadolinium oxysulphide phosphor) or CsI on an upper surface of the panel.

(Embodiment 2)

Figure 3:
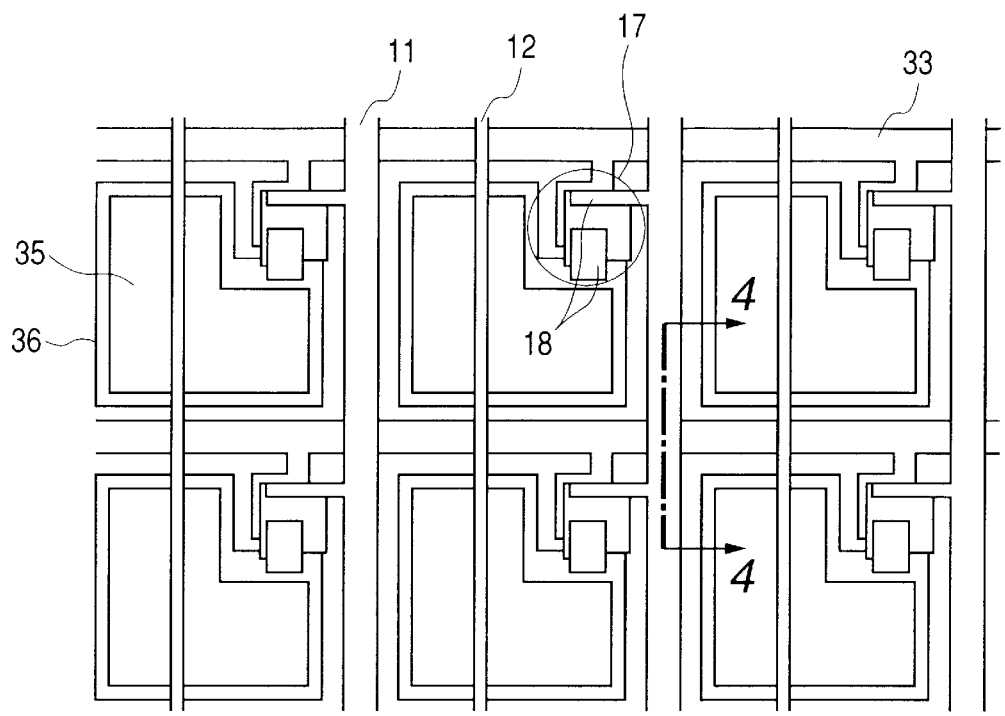
FIG. 3 is a schematic view showing a pattern of a TFT matrix panel according to a second embodiment of the present invention.

FIG. 3 is a view showing a pattern of a photoelectric conversion device using a TFT matrix panel according to Embodiment 2. In the figure, some elements performing similar functions to those shown in FIG. 1 have the same reference numerals as those in FIG. 1 and are not described here in detail. In this embodiment, MIS-type capacitors are used as photoelectric conversion elements 35. After carriers are generated by light incidence on the photoelectric conversion elements 35, a bias is applied by a driver to the signal lines 11 and the carriers are read out from electrodes 36. Further, a common electrode driver connected to the signal lines 11 can be driven to remove the stored carriers, thus refreshing the photoelectric conversion elements 35.

Figure 4:
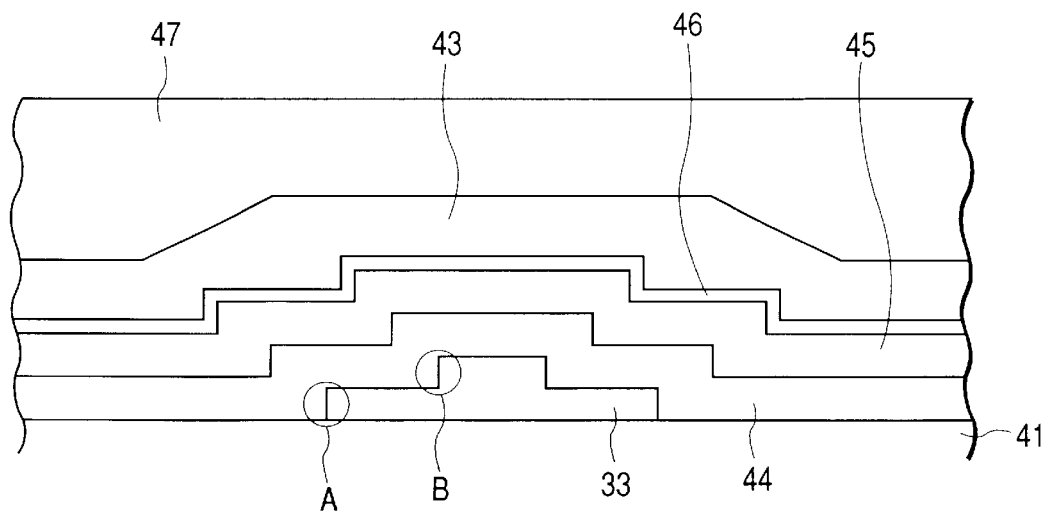
FIG. 4 is a sectional view taken along line 4—4 of FIG. 3.
Figure 5:
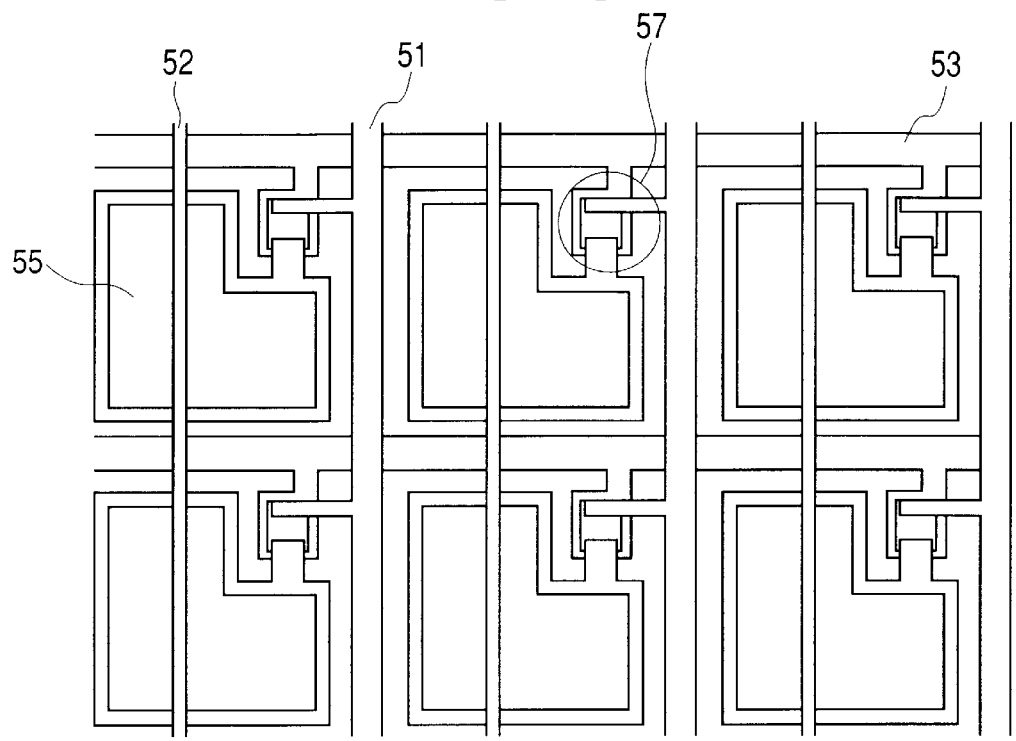
FIG. 5 is a schematic view showing an example of a pattern for a TFT matrix panel.

Now, a crossing of the signal line 11 and a gate line 33 is described. FIG. 4 is a sectional view taken along line 4—4 of FIG. 3. In this embodiment, the gate line 33 is a wiring arranged nearest to a glass substrate 41 of wirings formed on the substrate. A method of fabricating the TFT matrix panel according to this embodiment is described below.

1. After a metal layer made of Cr is deposited entirely on a surface of the glass substrate 41 in a thickness of 1000 to 5000 Å by sputtering, the gate line 33, a gate electrode of the TFT, and a lower electrode 36 of the MIS-type photoelectric conversion element are formed through photolithography.
2. As shown in FIG. 4, a step (or level difference) A at the crossing between wirings is formed by etching through photolithography.
3. Next, a step B is formed by half-etching through photolithography with a mask other than a mask used for the formation of the step A, specifically etching in a thickness of 500 to 2500 Å, which is about half the entire thickness of the deposited film forming the gate line 33.
4. Using a plasma CVD method, an SiN insulating layer 44 is formed in a thickness of 2000 to 4000 Å entirely on the surface of the substrate 41, then an i-type semiconductor layer 45 of a-Si is formed in a thickness of 3000 to 12000 Å, and an $n^+$-type semiconductor layer 46 is formed in a thickness of 300 to 2000 Å by a continuous process. Since the insulating layer 44, the semiconductor layer 45, and the $n^+$-layer 46 may be used commonly to the TFT section 17 and the MIS-type photoelectric conversion element 35, they may be fabricated through the same process.
5. The insulating layer 44, the semiconductor layer 45, and the $n^+$-layer 46 formed on the gate line 33 are removed, and then a contact hole is formed to connect a TFT source or drain electrode and the lower electrode 36 of the MIS-type photoelectric conversion element to each other. This process is accomplished by a RIE method after a predetermined pattern is formed through photolithography.
6. After the signal line 11 and the bias line 12 are formed of Al in a thickness of approximately 5000 to 20000 Å and TFT source/drain electrodes 18 are formed, a channel of the TFT section 17 is subjected to the RIE method to etch the $n^+$-type film by approximately 500 Å and the a-Si film by approximately 200 Å.
7. A prescribed pattern is formed through photolithography, and the $n^+$-type film, the a-Si film, and the SiN film are simultaneously etched by the RIE method to effect element isolation, and thereafter a protective film 43 made of SiN is formed as a passivation film in a thickness of 3000 to 15000 Å. Then, a polyimide protective film 47 is coated on the passivation film in a thickness of 2 to 10 $\mu$m by use of a spinner. The use of polymide which is photosensitive makes it possible to remove the electrode connected to the IC by photolithography.

The TFT matrix panel is fabricated by the above-mentioned process. In this embodiment, all of the insulating layer 44, the semiconductor layer 45, and the $n^+$-layer 46 are left below the signal line 11. This is because the element isolation has been effected after the formation of the signal line 11, but these layers may be removed by changing the sequence of the steps. Further, all of the insulating layer 44, the semiconductor layer 45, and the $n^+$ layer 46 are left at the crossing. This is because the semiconductor layer 45 and the $n^+$ layer 46 can be considered as insulators as long as the device operates in a usual manner. Therefore, the dielectric strength can be maintained without carrying out extra steps to remove the semiconductor layers of the crossing.

Referring to FIG. 4, since the gate line has the step (referred to "overstriding step") at the crossing of the gate line with the signal line or the bias line, the thickness (level difference) of the insulating film necessary to overstride the gate line is at most ½ of the maximum film thickness of the gate line, which provides better coverage at a corner portion or the like as compared with the case where no-steps are provided and ensure the dielectric strength of the insulating film. Although in this embodiment the single step is provided, it is needless to say that a plurality of steps (level differences) may be provided. This embodiment makes it possible to increase the film thickness of the gate line to reduce its wiring resistance, to maintain the dielectric strength at the crossings with the other wirings and to reduce the floating capacitance.

The semiconductor device according to this embodiment can also be used as a radiation detection device by providing a wavelength converter such as GOS (gadolinium oxysulphide phosphor) or CsI on an upper surface of the panel.

In addition, an MIS-type capacitor is used as a photoelectric conversion element in this embodiment and a PIN-type diode is used in Embodiment 1 by way of example. Of course, the two types of elements may be replaced by each other and other types of elements may be also used as the photoelectric conversion element. Moreover, the configuration according to this embodiment may be used simultaneously with the configuration according to Embodiment 1 to provide a more preferred TFT panel.

(Embodiment 3)

Figure 6:
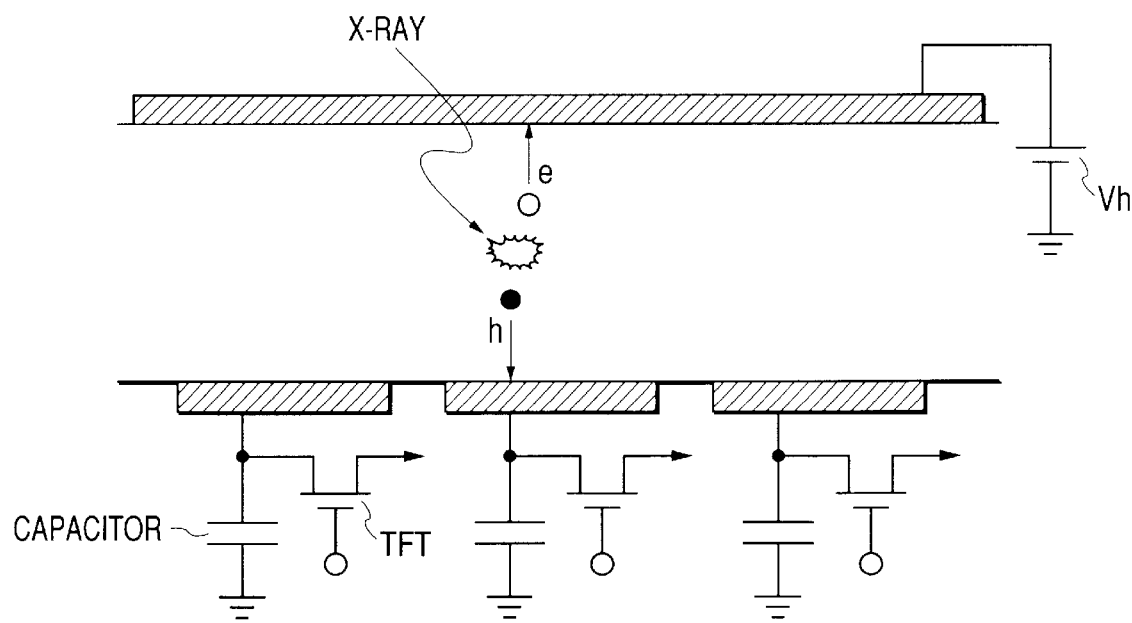
FIG. 6 is a schematic view showing the application of the TFT matrix panel according to the present invention to a direct-type radiation detection device.

In this embodiment, a radiation direct conversion element and a TFT panel used for a radiation detection device are described below. FIG. 6 is a schematic view showing the principle of this embodiment. When a radiation is incident on a direct conversion detector such as of GdTe, a-Se, $PbI_2$, etc. fixed with a constant bias, electron-hole pairs are generated, and electrons and holes travel in accordance with an electric field and are stored in capacitors as connected to the detector. Thereafter, they are sequentially transferred to a readout circuit by TFTs. If the capacitor is the MIS-type capacitor used in Embodiment 2, the TFT matrix panel of Embodiment 2 can be used as such. Using the TFT panel according to the present invention makes it possible to reduce the signal noise and to make large the storing capacitors to store a larger amount of charge, so that it can be preferably used for a direct radiation detection device.

(Embodiment 4)

Figure 7:
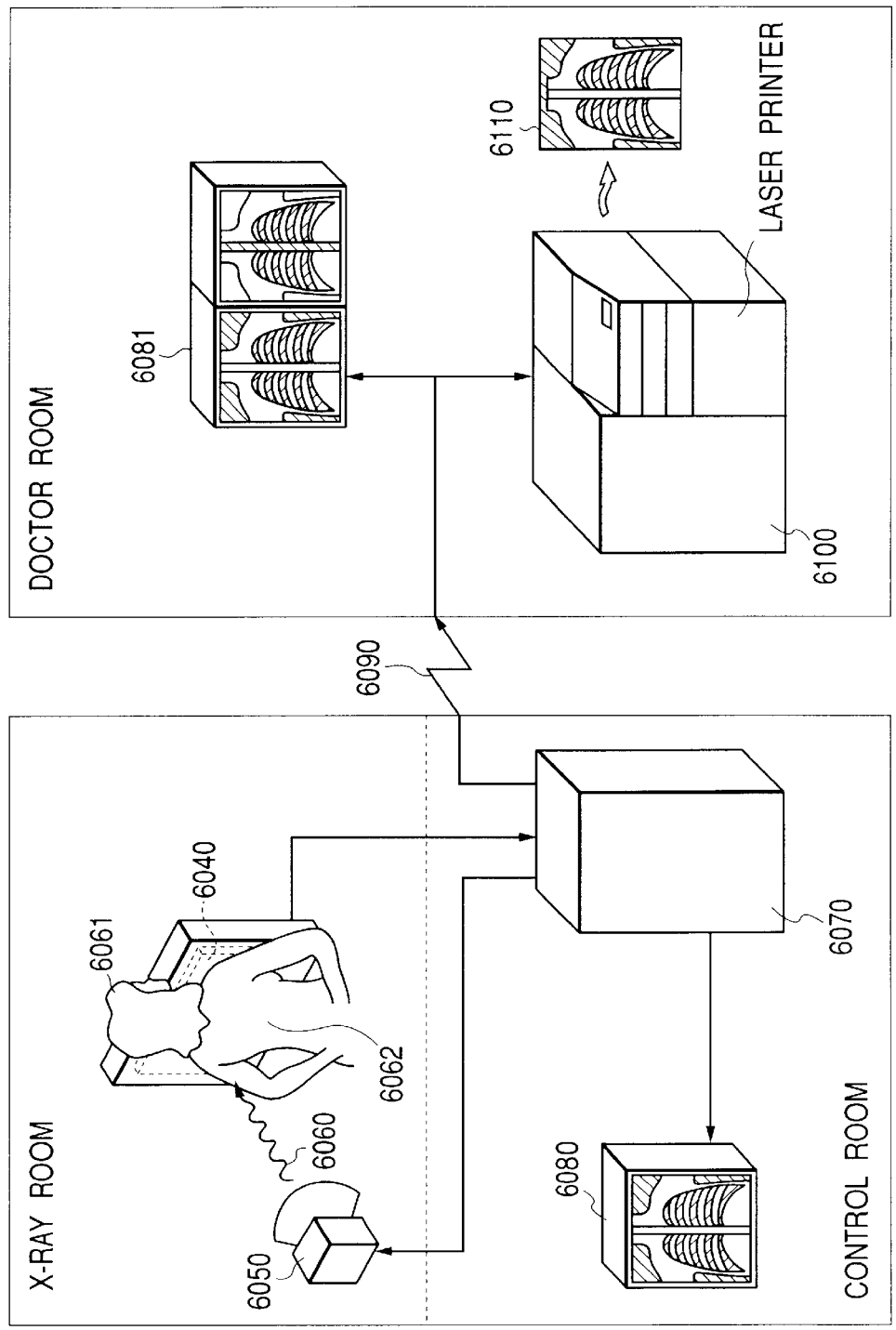
FIG. 7 is a schematic view showing an image when the semiconductor device according to the present invention is applied to a radiation detection system.

FIG. 7 is a schematic view showing the configuration of a radiation detection system. As shown in FIG. 7, in a radiation diagnostic system according to this embodiment, a radiation 6060 generated in a radiation tube 6050 pass through the chest part 6062 of a patient or subject 6061 and is then incident on a photoelectric conversion layer 6040 as installed on an upper part of a photoelectric conversion device.

The incident radiation contain an internal information of the body of the patient or subject 6061. In correspondence to the incidence of the radiation, the photoelectric conversion layer generates electrons and holes to provide an electrical information. The information is converted to a digital signal, which is picture-processed in a picture processor 6070 to be observed on a display 6080 in a control room.

In addition, the information can be transferred to a remote location through a transmission means such as a telephone line 6090 and can be displayed on a display 6081 in a doctor room or the like at a different location or can be stored in a storage means such as optical disks to permit diagnosis by a doctor at a remote location. Further, the information can be recorded on a film 6110 by a film processor 6100.

Incidentally, although this embodiment has been described with reference to the application of the photoelectric conversion device to the radiation detection system, it should be appreciated that the term "radiation" used herein refers to X-rays, α-rays, β-rays, γ-rays, or the like, and that the photoelectric conversion device of the present invention can apply to a radiation imaging system such as a non-destructive examination system or the like.

Figure 8:
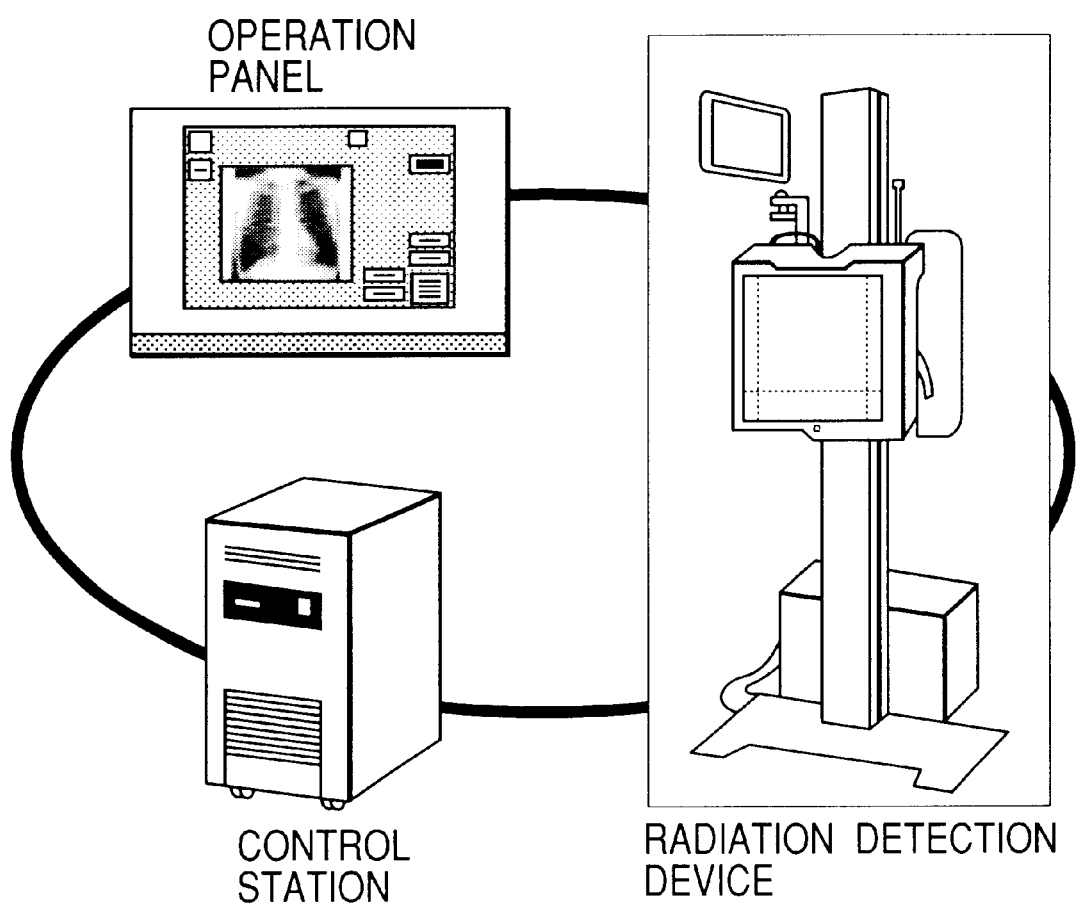
FIG. 8 is a schematic view showing another image when the semiconductor device according to the present invention is applied to a radiation detection system.

FIG. 8 is a view for explaining the above-mentioned radiation detection system in more detail and shows a radiation detection system having a radiation detection device using a photoelectric conversion element panel according to the present invention incorporated therein. This system includes a radiation detection device used for stand-up type X-ray imaging, an operation panel for operating the device, and a control station for controlling data storage and radiation detection sensors. The radiation detection device is formed by depositing or bonding a phosphor layer made of CsI or GOS, which converts a radiation into visible light, to the photoelectric conversion element panel. This makes it possible that an X-ray with linear directivity as emitted by an X-ray source passes through the body of a person who stands in front of the radiation detector, the passing X-ray is converted by the detector into visible light, which is then photoelectrically converted to enable imaging of an X-ray transmission distribution for a body region. This device can be used for the field of roentgen imaging as one of decubitus-type which is attached to a bed or of handy-type. Moreover, the device can be also used as a non-destructive examination system by causing a radiation to pass through an object other than human bodies. Although this embodiment has been described with reference to an indirect radiation detection device which detects a visible light converted from a radiation by a wavelength converter, it is needless to say that a direct detection device as described for Embodiment 3 can also be used.

What is claimed is:

1. A semiconductor device comprising:
   a thin film transistor (TFT) comprising a gate electrode formed on an insulating substrate, a gate insulating film formed on the gate electrode, and a pair of electrodes having a semiconductor layer and an ohmic contact layer therebetween; and
   a gate wiring connected to the gate electrode, and a signal wiring connected to one of the pair of electrodes,
   wherein the gate wiring and the signal wiring are arranged in superposition in the film thickness direction with an interlayer insulating layer therebetween to have a plurality of crossings with each other and the interlayer insulating layer has a plurality of steps overstriding a lower wiring at the crossings.

2. The device according to claim 1, wherein the lower wiring has a plurality of steps at the crossings.

3. The device according to claim 1, wherein the lower wiring is formed of a plurality of metal layers.

4. The device according to claim 3, wherein of the plurality of metal layers, the metal layer arranged nearer to the insulating substrate acts as an etch stopper during patterning and a step with such a height as to correspond to the film thickness of the lower wiring is formed by a plurality of times of patternings.

5. The device according to claim 1, further comprising a capacitor.

6. The device according to claim 5, wherein the capacitor is a MIS-type capacitor.

7. The device according to claim 6, wherein the MIS-type capacitor has the same layers as the layers forming the TFT gate electrode, the gate insulating film, the semiconductor layer, and the ohmic contact layer.

8. The device according to claim 7, further comprising a signal line connected to a source or drain electrode of the MIS-type capacitor and a bias line provided on the MIS-type capacitor, wherein a crossing of the signal line or the bias line with the gate line has a film constitution on the substrate of the gate line, the insulating layer, the semiconductor layer, the n$^+$ layer, and the signal line or the bias line in the mentioned order from the substrate side.

9. A radiation detection device having the semiconductor device as set forth in claim 1.

10. A radiation imaging system comprising:
    the radiation detection device as set forth in claim 9;
    signal processing means for operating the radiation detection device;
    recording means for recording a signal from the signal processing means;
    display means for displaying a signal from the signal processing means;
    transmitting means for transmitting a signal from the signal processing means; and
    a radiation source for generating a radiation.

11. A semiconductor device comprising:
    a thin film transistor (TFT) comprising a gate electrode formed on an insulating substrate, a gate insulating film formed on the gate electrode, and a pair of electrodes having a semiconductor layer and an ohmic contact layer therebetween; and
    a gate wiring connected to the gate electrode, and a signal wiring connected to one of the pair of electrodes,
    wherein the gate wiring and the signal wiring are arranged in superposition in the film thickness direction with an interlayer insulating layer therebetween to have a plurality of crossings with each other, the interlayer insulating layer has a plurality of steps overstriding a lower wiring at the crossings, and the film thickness of the lower wiring is smaller at the crossings than at a portion thereof not crossing.

12. The device according to claim 11, further comprising a capacitor.

13. The device according to claim 12, wherein the capacitor is a MIS-type capacitor.

14. The device according to claim 13, wherein the MIS-type capacitor has the same layers as the layers forming the TFT gate electrode, the gate insulating film, the semiconductor layer, and the ohmic contact layer.

15. The device according to claim 14, further comprising a signal line connected to a source or drain electrode of the MIS-type capacitor and a bias line provided on the MIS-type capacitor, wherein a crossing of the signal line or the bias line with the gate line has a film constitution on the substrate of the gate line, the insulating layer, the semiconductor layer, the n+ layer, and the signal line or the bias line in the mentioned order from the substrate side.

16. A radiation detection device having the semiconductor device as set forth in claim 11.

17. A radiation imaging system comprising:

the radiation detection device as set forth in claim 16;

signal processing means for processing a signal from the radiation detection device;

recording means for recording a signal from the signal processing means;

display means for displaying a signal from the signal processing means;

transmitting means for transmitting a signal from the signal processing means; and a radiation source for generating a radiation.

* * * * *